US008103927B2

United States Patent
Choi et al.

(10) Patent No.: US 8,103,927 B2
(45) Date of Patent: Jan. 24, 2012

(54) FIELD MOUNTING-TYPE TEST APPARATUS AND METHOD FOR TESTING MEMORY COMPONENT OR MODULE IN ACTUAL PC ENVIRONMENT

(75) Inventors: In-ho Choi, Yongin-si (KR); Woon-sup Choi, Cheonan-si (KR); Sung-yeol Kim, Yongin-si (KR); Young-ki Kwak, Cheonan-si (KR); Jae-il Lee, Yongin-si (KR); Chul-woong Jang, Cheonan-si (KR); Ho-sun Yoo, Seongnam-si (KR); In-su Yang, Seongnam-si (KR); Seung-ho Jang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 221 days.

(21) Appl. No.: 12/320,919

(22) Filed: Feb. 9, 2009

(65) Prior Publication Data

US 2009/0300442 A1    Dec. 3, 2009

(30) Foreign Application Priority Data

Jun. 2, 2008  (KR) ................. 10-2008-0051811

(51) Int. Cl.
*G01R 31/28*   (2006.01)

(52) U.S. Cl. ........................................ 714/741; 714/742
(58) Field of Classification Search .................. 714/741, 714/742
See application file for complete search history.

(56) References Cited

U.S. PATENT DOCUMENTS

| | | | | |
|---|---|---|---|---|
| 5,920,490 | A * | 7/1999 | Peters .......................... | 716/106 |
| 6,055,661 | A * | 4/2000 | Luk ............................. | 714/736 |
| 6,112,312 | A * | 8/2000 | Parker et al. ................... | 714/32 |
| 6,295,623 | B1 * | 9/2001 | Lesmeister et al. ........... | 714/741 |
| 6,507,210 | B1 * | 1/2003 | Olson ...................... | 324/764.01 |
| 7,222,279 | B2 * | 5/2007 | Tanimura ...................... | 714/735 |
| 7,437,261 | B2 * | 10/2008 | Pramanick et al. ........... | 702/117 |

* cited by examiner

*Primary Examiner* — James C Kerveros
(74) *Attorney, Agent, or Firm* — Harness, Dickey & Pierce, P.L.C (57) ABSTRACT

A field mounting-type test apparatus and method for enhancing competitiveness of a product by simulating various test conditions including a mounting environment for improving quality reliability of a memory device and by minimizing overall loss due to change in a mounting environment thus reducing testing time and cost. The field mounting-type test apparatus includes a mass storage device configured to store logic data simulating a mounting environment of a device under test (DUT) and a tester main frame configured to test the DUT using the logic data.

19 Claims, 7 Drawing Sheets

FIELD MOUNTING-TYPE TEST APPARATUS AND METHOD FOR TESTING MEMORY COMPONENT OR MODULE IN ACTUAL PC ENVIRONMENT

PRIORITY STATEMENT

This application claims priority under 35 U.S.C. §119 to Korean Patent Application No. 10-2008-0051811, filed on Jun. 2, 2008, in the Korean Intellectual Property Office (KIPO), the entire contents of which are herein incorporated by reference.

BACKGROUND

1. Field

Example embodiments relate to a tester apparatus, and more particularly, to a field mounting-type test apparatus and method for testing a memory component or a module in an actual PC environment.

2. Description of the Related Art

Wafers may be processed into individual chips using a fabrication process and subsequent processes. Electrical, thermal, and functional tests, during or after a packaging operation, may be used to classify the chips as non-defective chips and defective chips. However, such tests do not guarantee that a non-defective chip installed in a device, for example, a PC or a customer end (CE) device, will function properly.

Automation test equipment (ATE) is used as test equipment. ATE may be used to detect logical and/or parametric failures. ATE, however, is not reliable in terms of rapidly and easily detecting failures in actual operating environments. Therefore, even if a memory chip is tested by ATE, the memory chip may still fail in actual use. Logical failures may include opens/shorts and hard/soft failures, and parametric failures may include Icc, leakage current, setup/hold time, voltage and refresh failures.

Mounting tests have recently been introduced to determine whether a tested component or module will operate properly in an actual PC environment. In general, a memory module refers to an entire circuit board including the memory devices storing a desired capacity of data and a component refers to an individual memory device, for example, a memory integrated circuit (IC). Mounting tests may be classified into memory module mounting tests and component mounting tests.

In the mounting test, a test condition including a mounting environment may be simulated so that a memory device is tested under the test condition. The mounting test may be performed by a behavioral test technique (BTT) tester. However, a PC motherboard on which a chip is mounted is required for the BTT tester during the mounting test. Even when test logic is repeatedly experimented with, a PC motherboard is required. In addition, because only a logic value of a logic pattern testing a memory, e.g., a device under test (DUT), is captured and transmitted to the BTT tester so that a mounting environment is simulated, the mounting environment is restrictively simulated.

In the BTT tester, because a test is not performed on a single kind of PC motherboard due to the characteristic of test, various kinds of PC mother boards need to be prepared. In addition, even if the test is performed on the same kinds of PC motherboards, when chipsets of the PC motherboards are changed or are different, the PC motherboard needs to be newly prepared every time.

In addition, a reference memory for comparison with logic data used in order to check whether a DUT operates needs to be installed in a bus capture board disposed on a PC motherboard. The reference memory requires a memory having capacity equal to or greater than that of a DUT to be tested.

SUMMARY

Example embodiments provide a field mounting-type test apparatus and method, which may enhance competitiveness of a product by simulating various test conditions including a mounting environment so as to improve quality reliability of a memory device and by minimizing or reducing overall loss due to a change in a mounting environment so as to reduce testing time and cost.

In accordance with example embodiments, a field mounting-type test apparatus may include a mass storage device configured to store logic data simulating a mounting environment of a device under test (DUT) and a tester main frame configured to test the DUT by using the logic data.

In accordance with example embodiments, a field mounting-type test method may include capturing signal information from a signal generated by an external apparatus, the external apparatus providing a mounting environment of a DUT, storing the signal information as logic data in a mass storage device, calling the logic data from the mass storage device by a tester main frame, and testing the DUT.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

DETAILED DESCRIPTION OF EXAMPLE EMBODIMENTS

Example embodiments will now be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1:
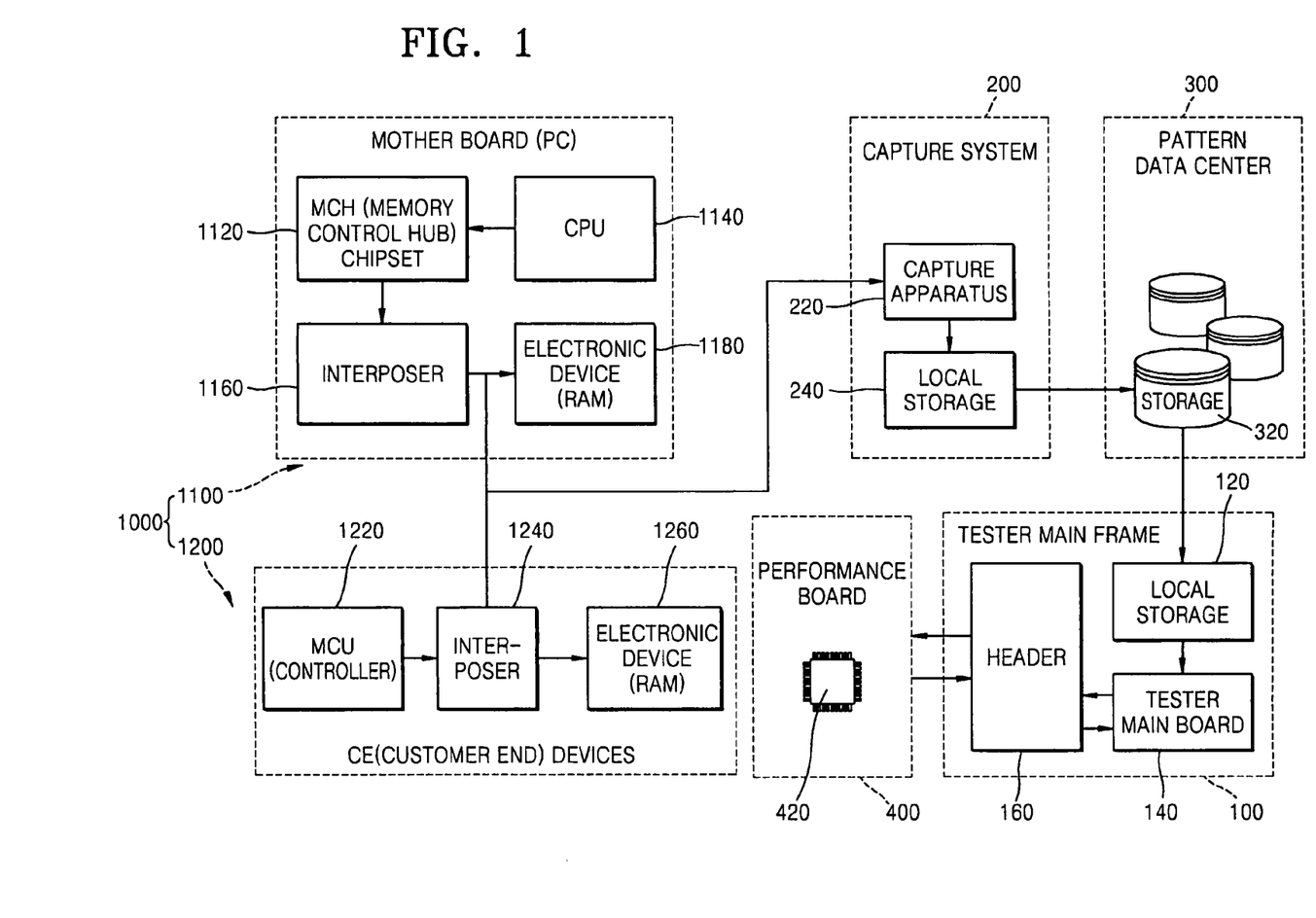
FIG. 1 is a block diagram of a field mounting-type test apparatus according to example embodiments.

FIG. 1 is a block diagram of a field mounting-type test apparatus according to example embodiments. Referring to FIG. 1, the field mounting-type test apparatus according to example embodiments may include a capture system 200, a pattern data center 300, a tester main frame 100, and a performance board 400. A chip, or module, to be tested is referred to as a design under test (DUT) 420 and the DUT 420 may be mounted on the performance board 400.

The capture system 200 is a system for capturing signal data from a signal generated by an external apparatus 1000, and may include a capture apparatus 220 to capture the signal data and a local storage apparatus 240 for temporarily storing the captured signal data. The capture apparatus 220 may include a capture board. The captured signal data may be used for test logic in a later described test process.

The capture system 200 may be connected to an external apparatus 1000 which may be similar or identical to an apparatus on which a DUT 420 is expected to be mounted. The external apparatus 1000 may contain a memory similar or identical to the DUT 420. The capture system 200 may capture all signal information used in a memory of the external apparatus 1000. For example, the external apparatus 1000 may be a PC motherboard 1100 or customer end (CE) device 1200. For example, the captured signal information may include every piece of signal information used in a memory module random access memory (RAM) (or, an electronic device) of the PC motherboard 1100 or CE device 1200. Examples of the signal information may include information regarding a logic value corresponding to a logic pattern, power information, information regarding a temperature at which a memory operates, signal integrity (SI) or power integrity (PI) information regarding an electric signal. The signal information is just an example. Thus, the signal information captured by the capture system 200 is not limited thereto, and may include other information that may be required during a device under test (DUT) test.

The capture system 200 may convert captured signal information into logic data and may align and compress the logic data to store the logic data. For example, the capture system 200 may receive a signal transmitted through an interposer and may capture signal information associated with the signal via the capture apparatus 220 and the capture apparatus 220 may convert the captured signal information into a logic value. In addition, the capture system 200 may collect information regarding the power of memory (e.g., a voltage of power), an operating temperature and SI/PI, and may align and compress the information in order to reduce the size of files stored in a mass storage device 320 of the pattern data center 300.

The compressed data may improve data integrity. For example, when data is decompressed, the data may be identically decompressed to original data. The logic data that is compressed may be stored in the local storage apparatus 240 of the capture system 200. The capture system 200 may be connected to a control PC via a user interface (UI), or alternatively, may allow a user to select signal information captured through the UI. In example embodiments, only information required by a user may be selectively captured.

A PC motherboard 1100 (an example of an external apparatus 1000 from which signal information may be captured by the capture system 200) may be a board on which a memory module or component (similar or identical to the DUT 420) is mounted. Currently, about one hundred kinds of PC motherboards have been introduced. For example, the PC motherboard 1100 may include a central processing unit (CPU) 1140, a memory control hub (MCH) chip set 1120 and a memory module RAM (or, an electronic device) 1180. The PC motherboard 1100 may further include an interposer 1160 mounted as a separate device by a user. In example embodiments, the capture system 200 may capture signal information, designated by the user, from a signal sent through the interposer 1160.

The CPU 1140 of the PC motherboard 1100 may control a PC and may perform various calculations. The MCH chip set 1120 may generate various electrical signals by a pattern generating program of the CPU 1140. Examples of the electric signals may include address signals (ADDR), data signal (DQs), control signals /RAS, /CAS and DQS. The electrical signals may be stored in the memory module RAM 1180 via the interposer 1160. The electrical signals transmitted from the MCH chip set 1120 to the memory module RAM 1180 may be captured as logic signals because the electrical signals may be transmitted through the interposer 1160 to the capture system 200.

In more detail, the interposer 1160 may be connected between the MCH chip set 1120 and the memory module RAM 1180, and may be mounted in a slot of the module RAM 1180 to transmit electrical signals transmitted from the MCH chip set 1120, for example, various signals for a test to the memory module RAM 1180 and the capture system 200. The MCH chip set 1120 may recognize the memory module RAM 1180 mounted on the interposer 1160 as a memory so that the MCH chip set 1120 operates as usual.

The field mounting-type test apparatus according to example embodiments may also capture electrical signal information from a CE device 1200. Examples of CE devices are portable multimedia players (PMP), game devices, personal digital assistants (PDA), printers, and MP3 players. The CE device 1200 may include a micro controller unit (MCU) 1220 or a controller having a function similar to a function of the MCU 1220, and a module RAM or component RAM storing electrical signal information for signals generated by the MCU 1220 or the controller having a function similar to the function of the MCU 1220. By mounting an interposer 1240 between the MCU 1220 and the module RAM 1260 in the CE device 1200, electrical signals transmitted through the interposer 1240 between the MCU 1220 and module RAM 1260 may also be sent to the capture system 200 where signal information for the electrical signals is captured and later used for a subsequent test.

The captured electrical signal information may relate to voltage, and may be different according to the kind of a module RAM of a PC motherboard or memory device of a CE device. In addition, the captured electrical signal information may include information regarding all address signals, e.g., ADDR, data signal DQs, control signals /RAS, /CAS, or DQS. with respect to a single chip from among a plurality of memory devices constituting a module RAM. For example, when a single component is configured by a total of 49 signals of ADDR[0:15] and BA[0:2], DQ[0:15] and Control[0:13], a capture system may capture information regarding the signals through an interposer.

The capture system 200 may capture electrical signal information for all the electrical signals through the interposers 1160 and 1240 of the PC motherboard 1100 and the CE device 1200. The captured electrical signal information may be temporarily stored in the form of a file in the local storage apparatus 240, and may be stored in the mass storage device 320 of the pattern data center 300. The stored electrical signal information may be appropriately output and used during the DUT test of the test main frame 100. Thus, the field mounting-type test apparatus according to example embodiments does not have to be connected to the PC motherboard 1100 or the CE device 1200 during a DUT test.

Conventionally, in order to capture various signals transmitted from a memory controller to a memory module RAM, for example, an address signal, a control signal, a data signal, and/or a power signal, a bus capture board is mounted on the memory module RAM of a PC motherboard. In addition, the BTT PC including the PC motherboard and the bus capture board is connected to a tester so as to perform a DUT test. Thus, a PC motherboard is always required during the DUT test, and each respective PC motherboard is required according to the kind of DUT.

The pattern data center 300 is a database including the mass storage device 320. The pattern data center 300 may store signal information for various signals captured through the capture system 200 as logic data for a DUT test. In example embodiments, the pattern data center 300 may store logic data, power information, information regarding an operating temperature, or SI/PI information. which may be captured from various kinds of chip sets, various kinds of PC motherboards and various kinds of CE devices, in the mass storage device 320. The pattern data center 300 may also be configured to transmit logic data required in the tester main frame 100 during the DUT test.

The pattern data center 300 may be connected to a control PC so as to process logic data that may be stored via a UI according to a user's need. For example, contents of logic data may be added, changed or merged by a UI. In addition, unnecessary logic data may be deleted if necessary. In example embodiments, the pattern data center 300 may collectively store various pieces of logic data captured through the capture system 200 according to the kind of logic data. If necessary, the pattern data center 300 may search the logic data so as to provide appropriate information to a mounting test body, for example, the tester main frame 100.

The pattern data center 300 may be installed in the field mounting-type test apparatus. Alternatively, the pattern data center 300 may be separate from the field mounting-type test apparatus, and may be connected to the capture system 200 or the tester main frame 100 by an interface only during a capturing or testing operation so as to store or transmit logic data.

The tester main frame 100 may include a local storage device 120, a tester main board 140 and a header 160. The local storage device 120 may download and temporarily store pattern data required for a test from the pattern data center 300 according to a test schedule, and may transmit the pattern data to the tester main board 140. In example embodiments, the tester main frame 100 may load logic data, power information, information regarding operating temperature and SI/PI information, which may be required to apply test logic to the DUT 420, from the pattern data center 300 to the local storage device 120 of the tester main frame 100.

The tester main board 140 may generate a signal waveform for test logic, for example, a logic signal for the DUT test by using an operation programmed using logic data stored in the local storage device 120 so as to apply the signal waveform to the DUT 420. In more detail, the tester main board 140 may decompress compressed logic data in order to apply the logic data to the DUT 420, and then align the decompressed data in a time sequence. After aligning the data, the power and the operating temperature may be matched to corresponding values stored in a storage device, and the aligned data may be applied to the DUT 420 as the logic signal via the header 160 and the performance board 400. The header 160 may apply the logic signal generated from the tester main board 140 to the DUT 420, and may function as a medium detecting a logic result pattern output from the DUT 420 and transmitting the logic result pattern to the tester main board 140.

The tester main board 140 may test the logic result pattern output from the DUT 420 to determine an operating state of the DUT 420. In example embodiments, the tester main board 140 may detect the logic result pattern output from the DUT 420 through the header 160, and may compare the logic result pattern with an expectation value stored in the local storage device 120. Thus, the tester main board 140 may determine whether an operation of the DUT 420 may be passed or failed. For example, when the output logic result pattern is the same as the expectation value (or at least within a margin of error), it is determined to have passed. When the output logic result pattern is not the same as the expectation value (or outside a margin of error), it is determined to have failed.

The tester main frame 100 may directly perform various kinds of DUT tests without connection with the PC motherboard 1100 or the CE device 1200 by using various kinds of logic data stored in the mass storage device 320. A PC may be connected to the tester main frame 100 via a UI, and thus a DUT test method or a result analysis method may be changed if necessary.

The DUT 420, e.g., a component chip or a module chip, may be mounted on the performance board 400. A plurality of performance boards may be installed in the tester main frame 100 during the DUT test, and thus a plurality of DUT tests may be simultaneously performed. In addition, by appropriately changing the tester main frame 100, different DUTs may be simultaneously tested.

Because the field mounting-type test apparatus according to example embodiments is not required to be connected to the PC motherboard 1100 or the CE device 1200 during the DUT test, the dependence on the PC motherboard 1100 or the CE device 1200 may be reduced, and accordingly, initial investment costs of test equipment or a testing time may be reduced. In addition, various pieces of test pattern data, which may be stored in the pattern data center 300 according to a manufacturer of the PC motherboard 1100 and a kind of a chip set, may be selected so as to perform a mounting test. Thus the field mounting-type test apparatus may be flexibly applied.

Figure 2:
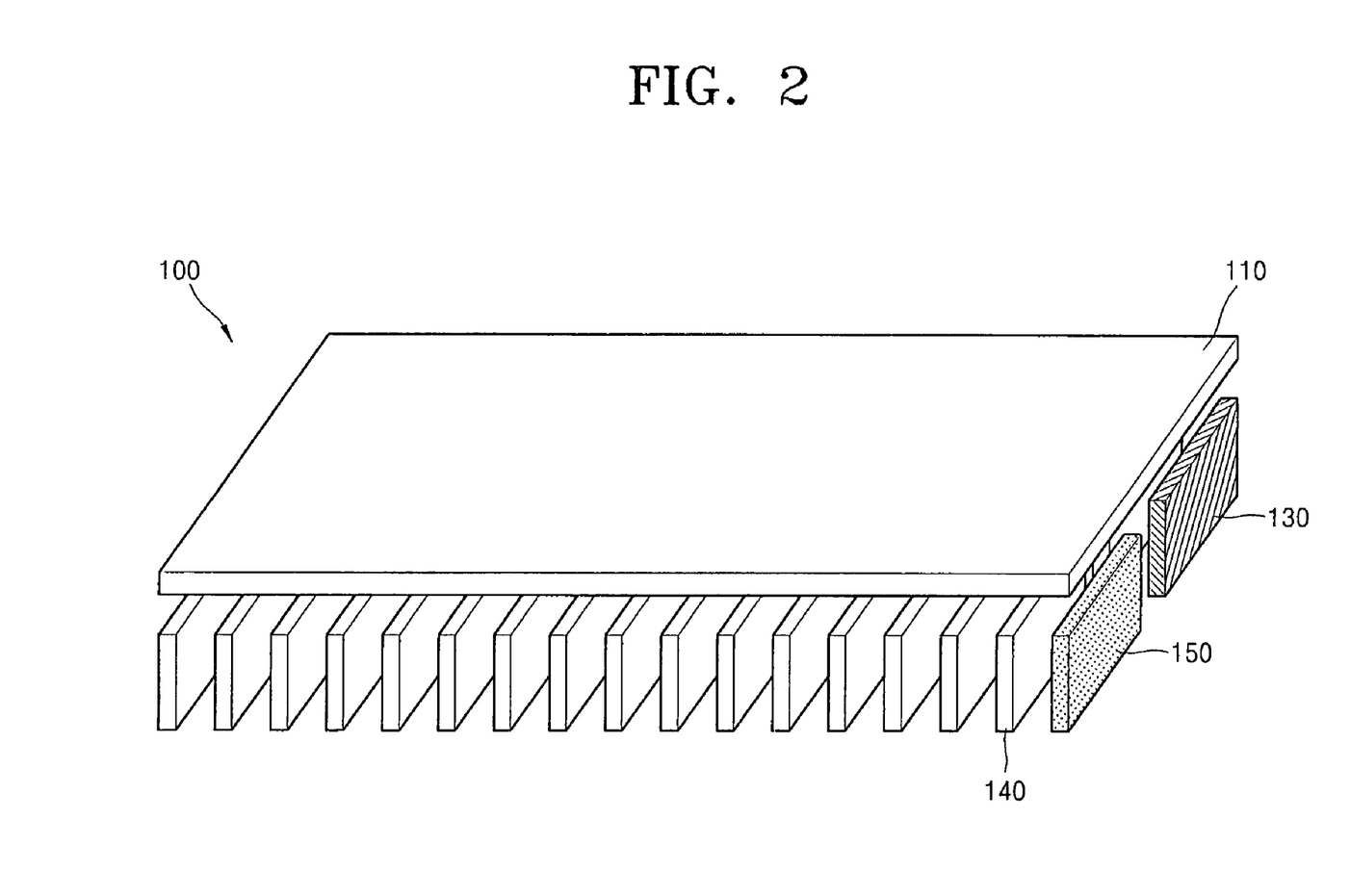
FIG. 2 is a perspective view of a tester main frame of a field mounting-type test apparatus of the field mounting-type test apparatus of FIG. 1, according to example embodiments.

FIG. 2 is a perspective view of the tester main frame 100 of the field mounting-type test apparatus of FIG. 1, according to example embodiments. Referring to FIG. 2, the tester main frame 100 may include a hi-fix board 110, a tester main board 140 and a header (not shown). The tester main frame 100 may further include a local storage device (not shown) connected to the hi-fix board 110.

The hi-fix board 110 may include the performance board 400 and a socket board in which a DUT 420 may be mounted. A plurality of tester main boards 140 may be connected to the hi-fix board 110. The tester main frame 100 may include a tester AUX board 130 performing an auxiliary function of the hi-fix board 110 and the tester main board 140, and a storage interface board (SIF) board 150 exchanging data with the local storage device (not shown).

In example embodiments, thirty two tester main boards 140 are connected to the hi-fix board 110, but example embodiments are not limited thereto. In example embodiments, the number of tester main boards 140 connected to the hi-fix board 110 may vary.

Figure 3:
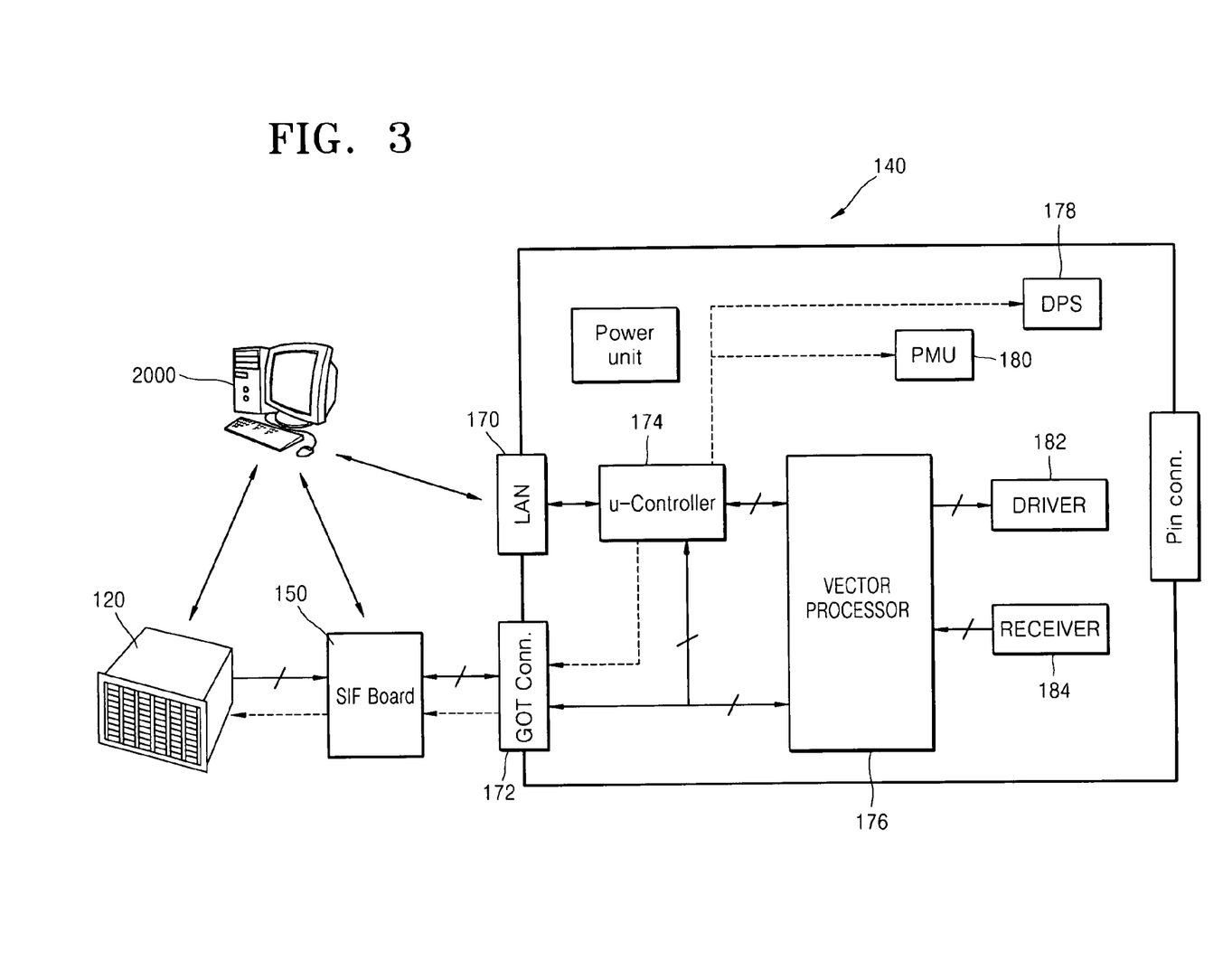
FIG. 3 is a block diagram of a tester main board of the field mounting-type test apparatus of FIG. 1, according to example embodiments.

FIG. 3 is a block diagram of the tester main board 140 of the field mounting-type test apparatus of FIG. 1, according to example embodiments. Referring to FIG. 3, a power connector (not shown), a local area network (LAN) connector 170 and a gigabit optical transmission (GOT) connector 172 may be connected to the outside of the tester main board 140, and each may be connected to a micro-controller 174 and a vector processor 176 to transmit data. The power connector may be connected to a power unit. The micro-controller 174 may be connected to a control PC 2000 to receive data or a control order from the control PC 2000 and to control the entire tester main board 140. A user may change or add data, or change an algorithm through a storage interface board 150 if necessary.

A vector processor 176 may generate a pattern to be applied to the DUT 420, and may perform a test vector decompression function selectively. In addition, the tester main board 140 may include a device power supply (DPS) 178 and parametric measurement unit (PMU) 180 for applying power to the DUT 420, a driver 182 changing a logic pattern from the vector processor 176 to an electric signal, and a receiver 184 receiving a signal output from the DUT 420. The above-described configuration of the inside of the tester main board 140 is merely an example, and other configurations may be applied if necessary.

In example embodiments, the tester main board 140 may be connected to the local storage device 120 through the SIF board 150 connected to the GOT connector 172. The local storage device 120 may be connected to the pattern data center 300 including a mass storage device 320 by using high-speed Ethernet (1 Gbps). Thus, the tester main board 140 may directly receive appropriate data from the pattern data center 300 during the DUT test.

Figure 4:
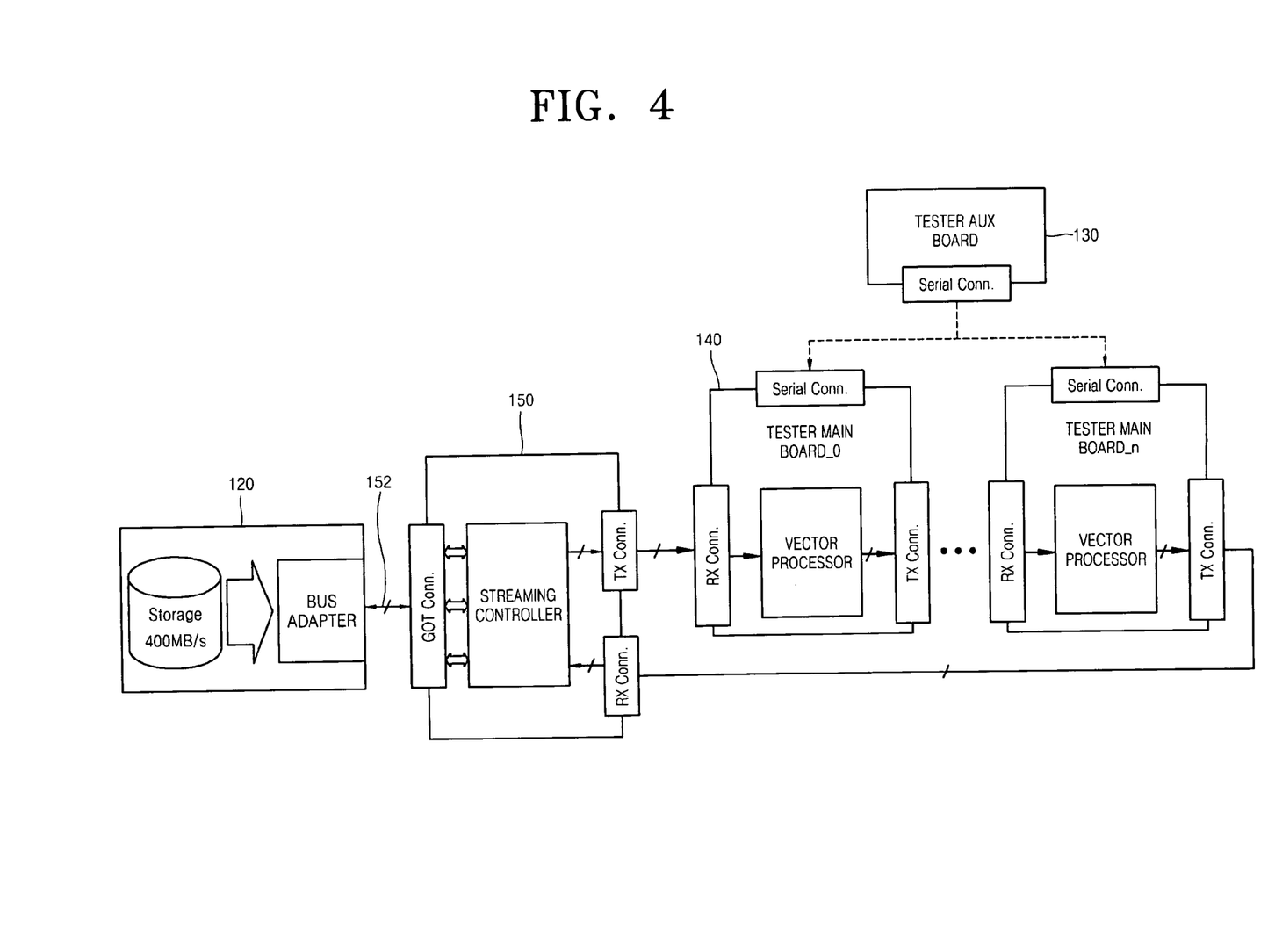
FIG. 4 is a block diagram of a storage interface (SIF) board between a tester main board and a local storage device of the field mounting-type test apparatus of FIG. 1, according to example embodiments.

FIG. 4 is a block diagram of the SIF board 150 that may be between the tester main board 140 and the local storage device 120, according to example embodiments. Referring to FIG. 4, the tester main board 140 may be connected to the local storage device 120 through the SIF board 150. The SIF board 150 and the local storage device 120 may be connected by an optical cable 152. In addition, the SIF board 150 and the tester main board 140 may be connected by a copper cable. In order to connect the SIF board 150 to the tester main board 140 by a cable, a ring topology configuration may be used. The tester AUX board 130 may be connected to the tester main board 140 by serial connection to exchange information regarding control of a test flow. However, example embodiments are not limited to a ring topology configuration.

Referring to FIGS. 1, 3 and 4, the SIF board 150 may include a streaming controller. The streaming controller controls a loading of a logic pattern to be applied to a DUT 420 mounted on a performance board 400 according to a command from the control PC 2000, and transfers the logic pattern to the tester main board 140 by communication with the tester main board 140.

Figure 5:
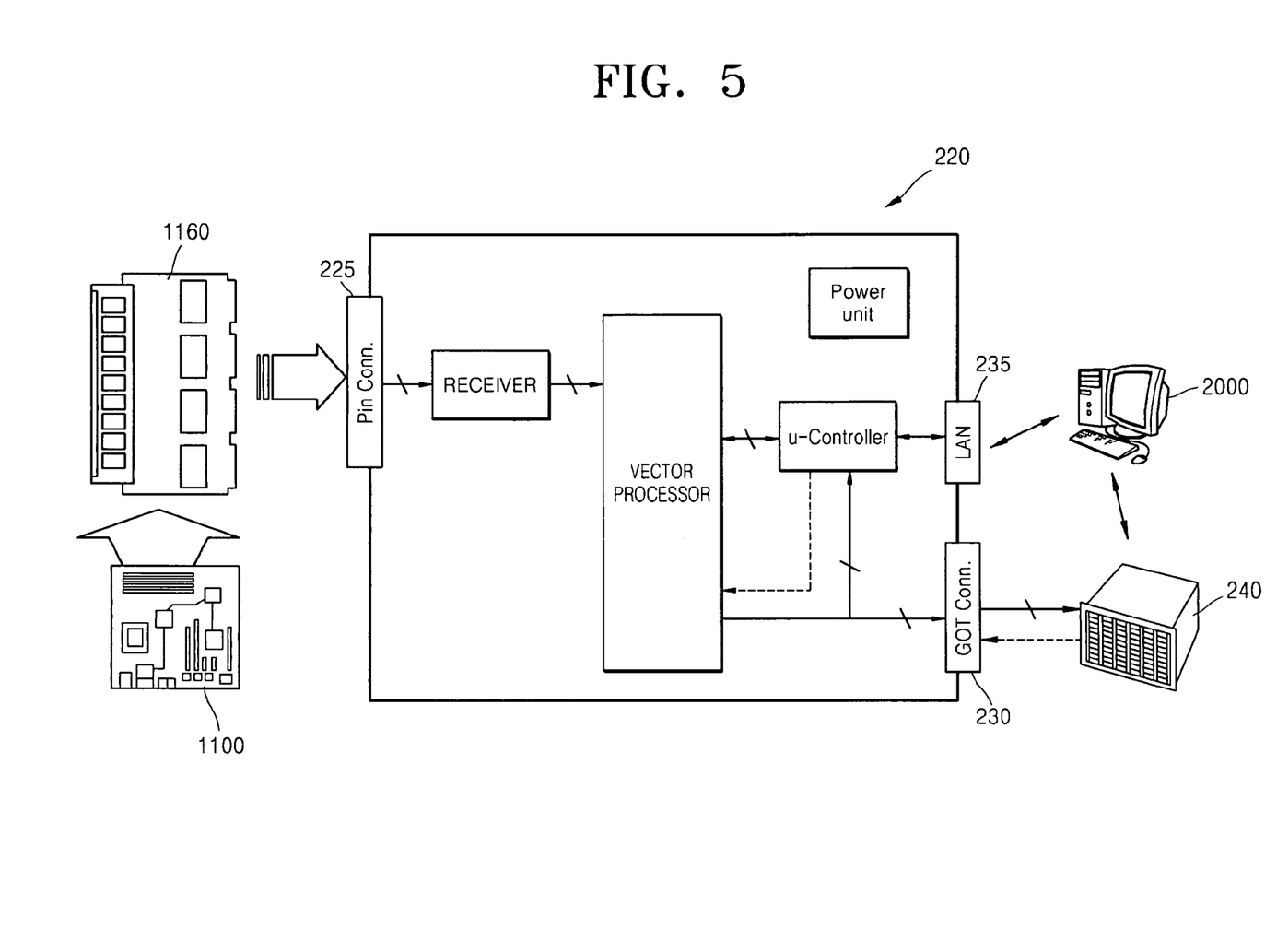
FIG. 5 is a block diagram of a capture main board of a tester system of the field mounting-type test apparatus of FIG. 1, according to example embodiments.

FIG. 5 is a block diagram of a capture main board of a tester system of the field mounting-type test apparatus of FIG. 1, according to example embodiments. Referring to FIG. 5, the capture apparatus 220 or the capture main board may be similar to the tester main board 140 of FIG. 3, but may differ from the tester main board 140 in that external memory field mounting-type apparatuses, e.g., the PC motherboard 1100 or the CE device 1200, may be connected to pin connectors 225 in order to capture signal information, and in that DSP and PMU, and the driver changing a logic pattern from a vector processor to an electrical signal may be removed.

The pattern data center 300 may be connected to the GOT connector 230 through an SIF board and the local storage apparatus 240, and the control PC 2000 may be connected to the LAN connector 235. The PC motherboard 1100 may be connected to the capture main board 220 through the interposer 1160 included in the PC motherboard 1100. In the case of a CE device (not shown), the CE device may also be connected to the capture main board 220 through the interposer (not shown).

Likewise, the capture main board 220 may have a similar configuration to a tester main board and may be installed in the hi-fix board 110 of the tester main frame 100 to capture a signal for a test. For example, the field mounting-type test apparatus according to example embodiments may include a single tester main frame 100. In the field mounting-type test apparatus according to example embodiments, the capture main board 220 may be installed in the single tester main frame 100 when capturing signal information for a test from the PC motherboard 1100 or the CE device. In addition, the tester main board 140 may be installed in the single tester main frame 100 during the DUT test so as to perform the DUT test.

Figure 6:
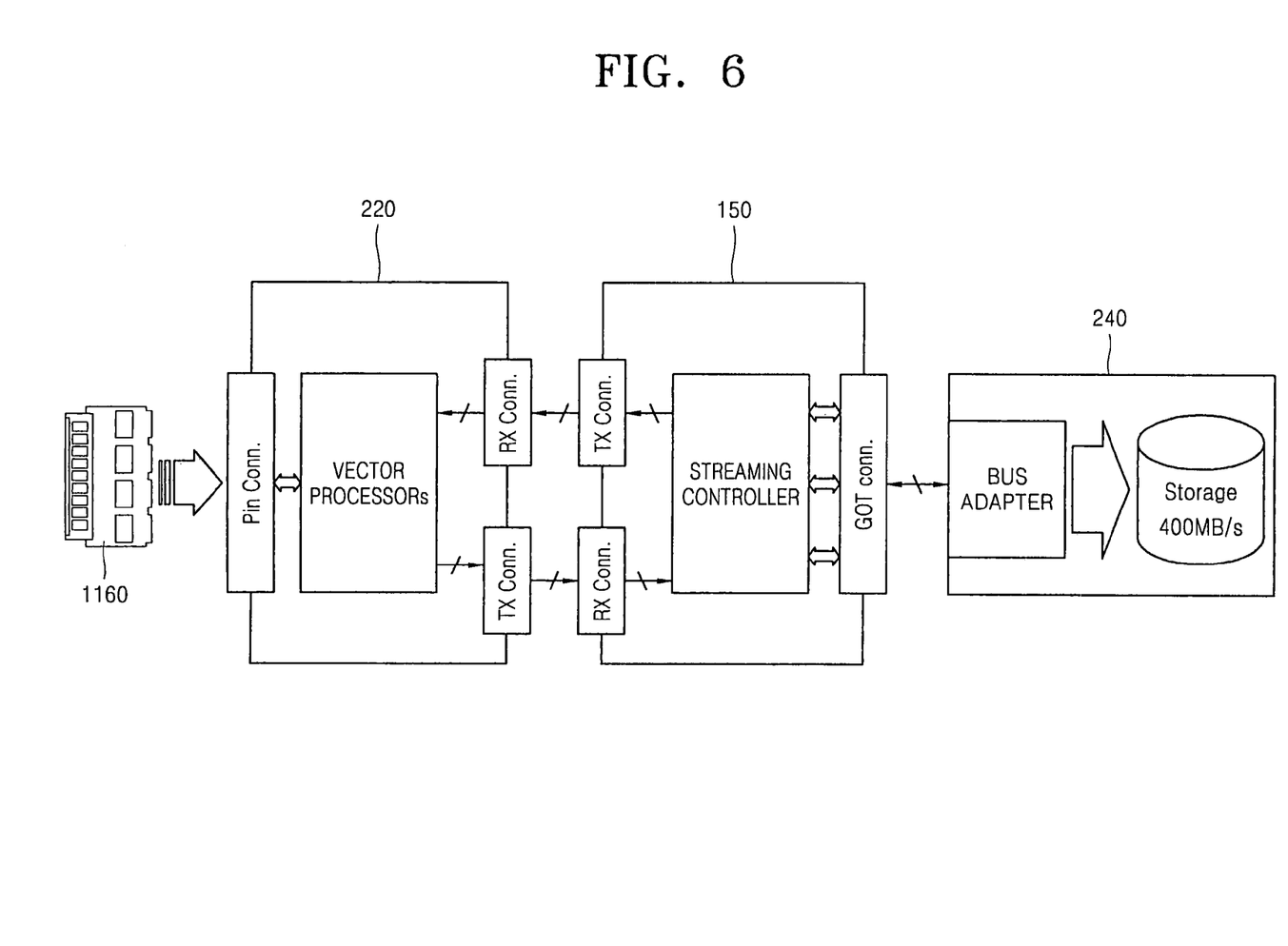
FIG. 6 is a block diagram of an interface between a capture main board and a local storage device of the field mounting-type test apparatus of FIG. 1, according to example embodiments.

FIG. 6 is a block diagram of an interface between the capture main board 220 and the local storage device 240 of the field mounting-type test apparatus of FIG. 1, according to example embodiments. Referring to FIG. 6, because a capture main board 220 may be similar to the tester main board 140, the SIF board 150 of FIG. 4 may be used as the interface between the capture main board 220 and the local storage device 240. For example, the SIF board 150 of FIG. 6 may be the same as the SIF board 150 of FIG. 4. Thus, a separate interface may not be required to connect the capture main board 220 to the local storage device 240, and the SIF board 150 of the tester main frame 100 may be used. As a result, in the field mounting-type test apparatus according to example embodiments, the capture main board 220 may be installed in the tester main frame 100 for capturing signal information only. During DUT testing, however, the capture main board 220 is not installed in the tester main frame, for this function the tester main board 140 is installed in the tester main frame 100.

Figure 7:
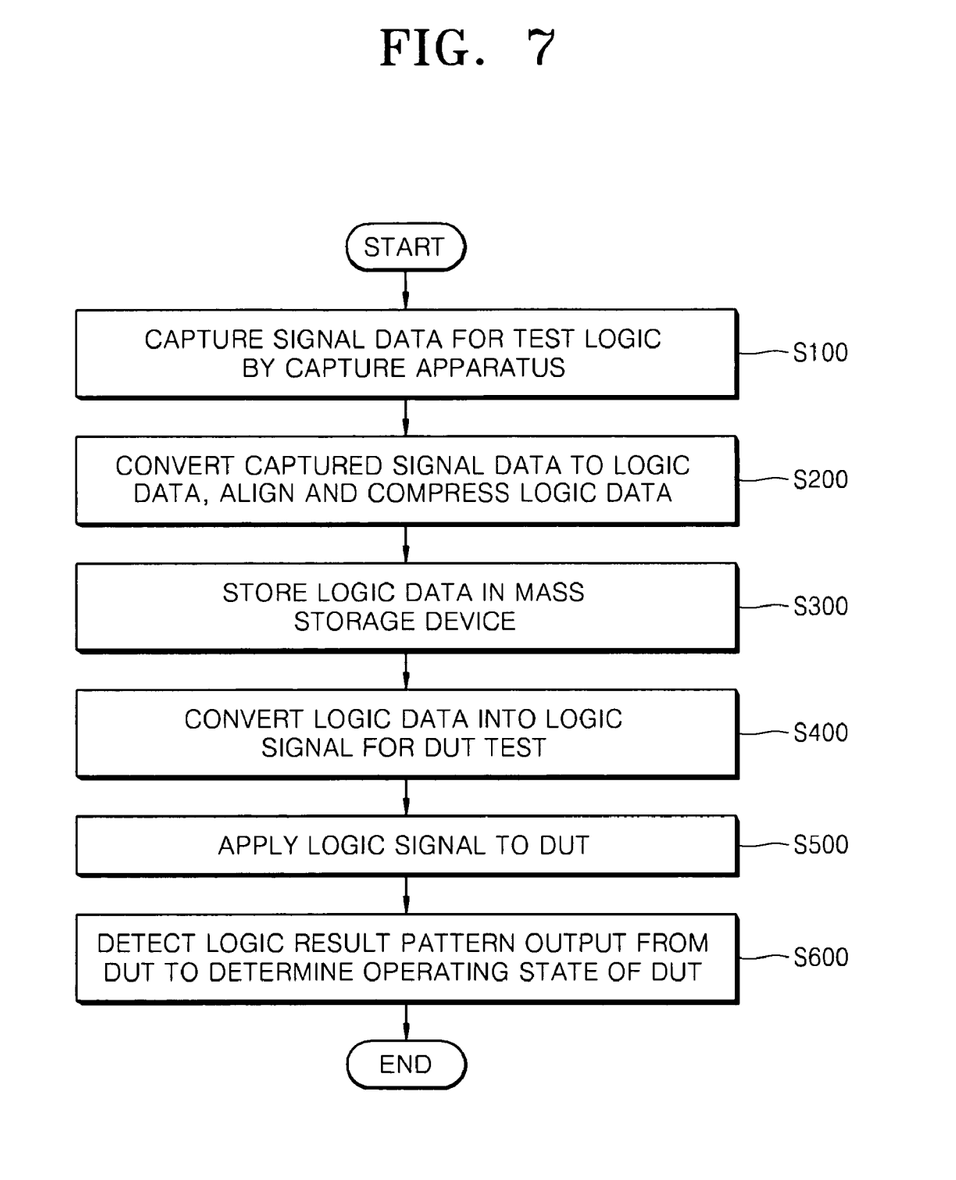
FIG. 7 is a flowchart of a field mounting-type testing method according to example embodiments.

FIG. 7 is a flowchart of a field mounting-type testing method according to example embodiments. Referring to FIG. 7, signal information for test logic may be captured by a capture apparatus from an external apparatus simulating a mounting environment of a DUT (S100). The external apparatus may be a PC motherboard or any kind of CE device. The captured signal information may be converted to logic data and then aligned and compressed (S200). The above process S200 may be performed in order to increase the efficiency of a memory, and may be performed by an automatic algorithm of the capture apparatus, or by a UI. Likewise, several pieces of logic data may be temporarily stored in a local storage device and then stored in a mass storage device of a pattern data center (S300). The several pieces of logic data that may be stored in the mass storage may be also processed, added to or deleted by the UI.

The above-described processes S100 to S300 may be performed whenever new test logic is required. However, if logic data for a particular chip environment is already available via the mass storage device, then processes S100 to S300 may be omitted.

A tester main frame may call logic data from the mass storage device 320 to temporarily store the logic data in a local storage device and may convert the logic data into a logic signal for the DUT test (S400). For example, the logic data compressed and stored in the mass storage may be converted into a signal waveform by using a programmed operation. The logic signal may be applied to the DUT through a header (S500), and then, a logic result pattern output from the DUT may be detected to determine an operating state of the DUT (S600). The operating state of the DUT may be determined by comparing the logic result pattern with an expectation value stored in the local storage device. When the logic result pattern is about the same as the expectation value, the operation of the DUT may be determined to have passed. When the logic result pattern deviates too far from the expectation value, the operation of the DUT may be determined to have failed.

As described above, even in the case of the tester main frame, a user may control the DUT test operation through a UI. According to the field mounting-type testing method of example embodiments, a plurality of DUTs may be simultaneously tested by the field mounting-type test apparatus. In addition, using various pieces of logic data stored in the mass storage device, various kinds of DUTs may be tested without connection with a new PC motherboard or CE device.

According to the field mounting-type test apparatus and method of example embodiments, a PC motherboard and a CE device are not required during a mounting test of a DUT. The PC motherboard and the CE device are required only for a first operation, and are not required for subsequent operations. Thus, because information regarding various motherboards may be stored in a single storage space, costs of a testing operation may be reduced regardless of changing types and characteristics of a motherboard and CE device.

In addition, according to the field mounting-type test apparatus and method of example embodiments, by storing logic data for a test in a storage space of a system, a user may organize logic data. For example, contents of the logic data may be edited, and a user may select and test only a necessary portion. The types of motherboard and CE device are not related, and logic data may be merged between different motherboards and CE devices.

In the case of a conventional field mounting-type test apparatus, a reference memory is always required for storing and generating a reference value in a capture board. However, the reference memory for performing a pre-test is expensive and rare. In example embodiments, the design may be simplified and costs may be reduced without the reference memory.

Moreover, conventional field mounting-type test equipment supports only a PC motherboard, and simulates a mounting test by using logic data of the PC motherboard. However, in example embodiments, in addition to the PC motherboard, logic data, power information and information regarding an operating temperature of a CE device are stored and reproduced, and thus, the PC motherboard may correctly simulate the mounting environment.

While example embodiments have been particularly shown and described with reference to example embodiments thereof, it will be understood by those of ordinary skill in the art that various changes in form and details may be made therein without departing from the spirit and scope of the following claims.

What is claimed is:

1. A field mounting-type test apparatus comprising:
a mass storage device configured to store logic data simulating a mounting environment of a device under test (DUT); and
a tester main frame configured to test the DUT by using the logic data, wherein
the logic data is determined according to an external apparatus,
contents of the logic data are added to, changed or merged by a user interface (UI) connected to the mass storage device, and
the field mounting-type test apparatus is configured to simultaneously test a plurality of DUTs which are the same or different from each other using the logic data.

2. A field mounting-type test apparatus comprising:
a mass storage device configured to store logic data simulating a mounting environment of a device under test (DUT); and
a tester main frame configured to test the DUT by using the logic data; and
a capture system configured to capture signal data from a signal generated by an external apparatus and configured to convert the captured signal data to logic data, wherein
the mass storage device is further configured to store the logic data generated by the capture system, and
the logic data is determined according to an external apparatus.

3. The field mounting-type test apparatus of claim 2, wherein the capture system includes
a capture apparatus configured to capture the signal data, and
a local storage apparatus configured to temporarily store the signal data.

4. The field mounting-type test apparatus of claim 3, wherein the capture apparatus is configured to convert the captured signal data into logic data, and configured to align and compress the logic data generated by the capture system.

5. The field mounting-type test apparatus of claim 2, wherein contents of the logic data are added to, changed or merged by a user interface (UI).

6. The field mounting-type test apparatus of claim 2, wherein the tester main frame includes
- a local storage device configured to download and temporarily store the logic data required for a DUT test from the mass storage device according to a test schedule, and configured to transmit the logic data to a tester main board;
- a tester main board configured to generate a logic signal for the DUT test using the logic data, test a logic result pattern output from the DUT, and determine an operating state of the DUT; and
- a header configured to apply the logic signal to the DUT and detect the logic result pattern, the header being further configured to output the logic result pattern to the tester main board.

7. The field mounting-type test apparatus of claim 6, wherein the tester main board is configured to compare the logic result pattern with an expectation value stored in the local storage device to determine whether an operation of the DUT has passed or failed.

8. The field mounting-type test apparatus of claim 2, further comprising:
- a performance board on which the DUT is mounted for testing.

9. The field mounting-type test apparatus of claim 2, wherein the capture system, the mass storage device, and the tester main frame are connected to a control PC through a UI.

10. The field mounting-type test apparatus of claim 2, wherein the signal data includes signal data used for testing a chip and the logic data includes information regarding a logic value for logic, power information regarding a memory, information regarding an operating temperature, and signal integrity and power integrity information.

11. The field mounting-type test apparatus of claim 2, wherein the field mounting-type test apparatus is configured to simultaneously test a plurality of DUTs which are the same or different from each other by using logic data stored in the mass storage device without connection to the external apparatus.

12. A system comprising:
the field mounting-type test apparatus of claim 2, wherein the external apparatus is at least one of a PC motherboard and a customer end (CE) device.

13. The system of claim of claim 12, wherein,
the PC motherboard includes
a central processing unit (CPU),
a chipset configured to generate signals for the logic data using a pattern generating program of the CPU,
a module random access memory (RAM) configured to receive the signals from the chipset, and
an interposer connected to the chipset and the module RAM and configured to transmit the signals generated by the chipset to the module RAM and the capture system, and the CE device includes,
at least one of a micro controller unit (MCU) having a given function and configured to generate an electrical signal and a controller having a predetermined function and configured to generate an electrical signal,
at least one of a module RAM and a component RAM each configured to receive an electrical signal generated from the MCU or the controller, and
an interposer connected to the MCU or the controller and the module RAM or the component RAM and configured to transmit an electrical signal from the MCU or the controller to the module RAM or the component RAM and the capture system.

14. A field mounting-type test method comprising:
capturing signal information from a signal generated by an external apparatus, wherein the external apparatus provides a mounting environment of a DUT and the signal information is captured by a capture apparatus;
converting the signal information to logic data by the capture apparatus;
storing the logic data in a mass storage device; and
calling the logic data from the mass storage device by a tester main frame; and
testing the DUT.

15. The method of claim 14, further comprising:
aligning and
compressing the logic data, by the capture apparatus prior to storing; and
temporarily storing the logic data in a local storage device.

16. The method of claim 14, wherein storing the signal information includes adding to, changing or merging the logic data by a UI.

17. The method of claim 14, wherein testing the DUT comprises:
downloading and temporarily storing the logic data from the mass storage device according to a test schedule;
calling the logic data to generate a logic signal for the DUT test;
applying the logic signal to the DUT;
detecting a logic result pattern output from the DUT; and
determining an operating state of the DUT by comparing the logic result pattern with an expectation value stored in a local storage device of the tester main frame.

18. The method of claim 14, wherein the testing the DUT involves simultaneously testing a plurality of DUTs which are the same or different from each other by using logic data stored in the mass storage device without connection to the external apparatus.

19. A system test method comprising:
the method of claim 14, wherein the external apparatus is one of a PC motherboard and a CE device, and capturing signal information includes capturing signal information from a signal provided through an interposer included in the one of the PC motherboard and the CE device.

* * * * *